United States Patent [19]
Monahan
[11] 3,795,824
[45] Mar. 5, 1974

[54] TRANSISTOR SWITCHING CIRCUIT

[75] Inventor: Joseph E. Monahan, Framingham, Mass.
[73] Assignee: Honeywell Inc., Minneapolis, Minn.

[22] Filed: Sept. 13, 1971
[21] Appl. No.: 180,146

Related U.S. Application Data
[63] Continuation of Ser. No. 681,411, Nov. 8, 1967, abandoned.

[52] U.S. Cl. .................... 307/255, 307/237
[51] Int. Cl. .................... H03k 17/00
[58] Field of Search ..... 307/255, 254, 237; 328/169

[56] References Cited
UNITED STATES PATENTS
3,125,694 3/1964 Palthe .................... 307/237
3,538,353 11/1970 Hanger .................... 307/236 X
3,246,080 4/1966 Ritchey, Jr. .................... 307/255
2,788,442 4/1957 Smith .................... 328/169

*Primary Examiner*—John S. Heyman
*Assistant Examiner*—B. P. Davis
*Attorney, Agent, or Firm*—John S. Solakian; Ronald T. Reiling

[57] ABSTRACT

The provision of a base clamp on an emitter-follower transistor enables the transistor to turn on to a selected level in a brief time without saturation.

10 Claims, 3 Drawing Figures

INVENTOR.
JOSEPH E. MONAHAN
BY W. Hugo Liepmann
ATTORNEY

TRANSISTOR SWITCHING CIRCUIT

This is a continuation of application Ser. No. 681,411, filed Nov. 8, 1967, now abandoned.

BACKGROUND

This invention relates to a transistor switching circuit improvement that enables an emitter-follower transistor to be turned on to a selected level of voltage at the emitter in a brief time and without saturation. The improvement also reduces the requirements on the electrical supply powering the transistor.

The invention is useful in switching circuits having emitter-follower stages. For example, the invention is useful in constructing improved monostable circuits and digital-to-analog converters. Further, the invention can be practiced with transistor circuits of any construction, e.g. discrete component and integrated circuit.

It is an object of the invention to provide improved transistor switching equipment, and in particular to provide an improvement in transistor switching circuits called upon to develop a voltage of specified magnitude.

Another object of the invention is to provide improved transistor switching equipment wherein the transistor turn-on operation rapidly drives the emitter to a selected voltage. A further object is to provide equipment that attains such operation without saturation of the transistor.

Further particular objects of the invention include the provision of an improved transistor monostable circuit having a brief recovery time; an improved high-speed transistor power driving switch; and an improved transistor switching circuit providing known output levels at high speed.

Other objects of the invention will in part be obvious and will in part appear hereinafter.

The invention comprises the features of construction, combinations of elements and arrangement of parts exemplified in the constructions hereinafter set forth, and the scope of the invention is indicated in the claims.

SUMMARY

In brief, the invention provides a clamp that limits the turn-on voltage applied to the base of an emitter-follower transistor. In a preferred embodiment, this consists of connecting a diode clamp between the transistor base and a source of a reference voltage having a lesser magnitude than the collector supply voltage. The diode can be the semiconductor junction formed by the transistor base and a further, second, emitter on the transistor.

With this arrangement, the transistor attains full turn-on operation to the known reference voltage in considerably less time than would otherwise be required to achieve the conventional turn-on operation to the collector supply voltage. Further, the base clamp prevents the transistor from saturating, regardless of the transistor load impedance or input base signal. As a result, the transistor can be turned off without the delay attendant to switching a saturated transistor.

A further advantage of the circuit is that the transistor draws relatively little current from the reference voltage supply. Hence, this supply can have a relatively high internal impedance, a requirement that is relatively easy to satisfy as contrasted to the provision of a low impedance reference supply.

BRIEF DESCRIPTION OF FIGURES

For a fuller understanding of the nature and objects of the invention, reference should be had to the following detailed description taken in connection with the accompanying drawings, in which.

DESCRIPTION OF PREFERRED EMBODIMENTS

Figure 1:
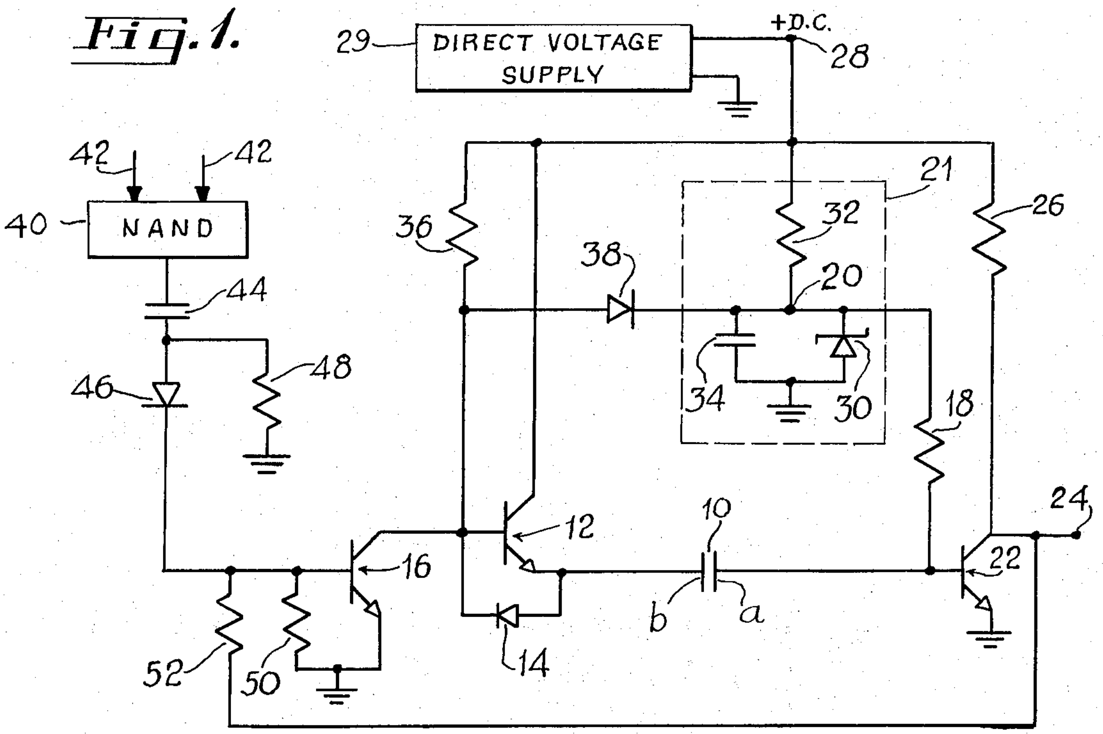
FIG. 1 is a schematic representation of a monostable circuit embodying the invention.

FIG. 1 shows a monostable circuit in which a timing capacitor 10 discharges through the series combination of a diode 14 and a transistor 16 and charges through a transistor 12.

A resistor 18 is connected between the capacitor plate **10*a* and a terminal 20 at which a reference supply 21 develops a reference voltage. The plate 10*a* is also connected to the base of a transistor 22 having a grounded emitter. The collector of the transistor 22 is connected to the circuit output terminal 24 and a resistor 26 is connected between the collector and the positive voltage a direct current supply 29 develops at a supply terminal 28.**

The reference voltage at terminal 20 is developed with a Zener diode 30 having a grounded anode and having a resistor 32 connected between its cathode and the supply terminal 28. In addition, a filter capacitor 34 is in parallel with the Zener diode. The Zener breakdown voltage of the diode 30 is materially less than the supply voltage at the terminal 28; a preferable value is that the Zener voltage, and correspondingly the reference voltage, be in the order of two-thirds of the supply voltage.

As also shown in FIG. 1, the emitter of transistor 12 is connected to the capacitor plate **10*b*, and the collector is connected to the supply terminal 28. A resistor 36 is connected between the supply terminal 28 and the transistor base. A clamp diode 38 is connected between the base and the reference terminal 20 and arranged to conduct forward current in the same direction as the forward conduction of the transistor's base-emitter junction; i.e. away from the base of the npn transistor 12.**

A diode 14 is in parallel with the transistor 12 base-emitter junction and arranged to conduct forward current in the opposite direction from the forward conduction of that junction.

The illustrated input stage for the monostable circuit has a NAND circuit 40 having plural input leads 42 and an output lead connected to a differentiating network formed with series capacitor 44 and shunt resistor 48. A diode 46 is connected to conduct forward current from capacitor 44 to the base of the transistor 16, which has its emitter grounded and its collector connected both to the base of transistor 12 and the cathode of diode 14. A bias resistor 50 is connected to ground from the base of transistor 16 and a feedback resistor 52 is in series in a feedback path connected from the output terminal 24 to the base of transistor 16.

Considering the operation of the monostable circuit of FIG. 1, when the NAND circuit 40 receives all positive signals, its output is at ground. In this condition, the transistor 16 is non-conductive and its collector is free to rise toward the positive supply at the terminal 28. This allows the transistors 12 and 22 to be conductive, and each draws base and collector currents to develop an output current at its emitter.

With transistor 22 on, its base and correspondingly the capacitor plate 10*a*, and its collector and the output terminal 24, are near the ground potential at the emitter. Also, the conducting transistor 12 applies the reference voltage at terminal 20 to the other capacitor plate 10*b*, and hence nearly the full reference voltage ($V_{REF}$) is across the capacitor. The foregoing describes the quiescent condition of the stable state of the FIG. 1 circuit.

The astable state of the circuit begins when one or more inputs of NAND circuit 40 receive a ground level signal. In response, the NAND output signal rises to a positive level. The capacitor 44-resistor 48 network differentiates this transition and the diode 46 conducts the positive portion of the resultant signal to the base of transistor 16, thereby turning the transistor on with the result that its collector drops nearly to ground potential. This voltage drop turns off transistor 12, but renders diode 14 conductive so that the diode couples the voltage drop to the capacitor plate 10*b*. The voltage across the capacitor 10 cannot change instantaneously and hence the drop is applied also to the other plate 10*a* and to the base of transistor 22, thereby turning off the latter transistor. The capacitor plate 10*b* is now clamped to slightly above ground through the conducting diode 14 and the emitter-collector path of the conducting transistor 16. The other plate 10a is still nearly $V_{REF}$ volts below plate 10*b* and hence is at substantially $-V_{REF}$volts.

With the transistor 22 switched non-conducting, the voltage at its collector, and hence at the output terminal 24, rises toward the supply voltage terminal 28. This positive voltage is fed back through transistor 52 to the base of transistor 16 and holds the latter transistor conductive. Continued conduction in transistor 16 holds diode 14 conductive and hence holds the capacitor plate 10*b* at the near-ground level. Further, it holds transistor 12 non-conductive.

However, resistor 18 immediately begins to charge the capacitor plate 10*a* from the reference voltage at terminal 20. As soon as the plate 10a is charged positive to the point where the transistor 22 emitter-base junction is forward biased, that transistor switches back to its normal conduction state, thereby terminating the astable state of the circuit.

During the subsequent initial portion of the stable state, the circuit is in a transient recovery condition where the capacitor 10 charges to the reference voltage. In particular, resumption of conduction in transistor 22 drops the output voltage at terminal 24 to near ground and turns off input transistor 16 by removing the positive base feedback signal. This allows transistor 12 to turn on and initiate charging of the capacitor plate 10*b* with its emitter current, which is the sum of the base current drawn through resistor 36 plus the collector current drawn directly from the supply terminal 28. The emitter-base voltage drop in transistor 12 reverse-biases the diode 14 to have a comparatively high impedance during this recovery operation.

At the initiation of the recovery operation, the transistor 12 emitter is at the same near-ground potential as at the capacitor plate 10*b*. The transistor base is at a slightly higher potential equal to the emitter potential plus the relatively small emitter-base drop. The transistor collector, however, is essentially at the terminal 28 supply potential.

As capacitor 10 charges, the voltage at the emitter of transistor 12 rises correspondingly and the transistor base voltage also rises, being more positive than the emitter by the small transistor internal voltage drop. However, the diode 38 connected between the transistor 12 base and the reference terminal 20 limits this positive excursion in the voltage at the transistor base. That is, when the voltage at the base of transistor 12 rises to the reference voltage plus the forward-voltage drop of diode 38, the diode conducts and clamps the base at this level, preventing it from going more positive. This operation prevents the emitter of transistor 12 from rising further and hence terminates the recharging of the capacitor 10 and, similarly, the recovery operation of the circuit.

That is, as soon as the transistor 12 charges the capacitor 10 to the point where the diode 38 clamps the base of transistor 12, the circuit is fully recovered. Transistor 12 is then developing a stable known voltage at its emitter.

The advantages provided by the diode 38 will now be considered in further detail. First, it speeds up the recovery operation of the circuit, i.e. it shortens the time from the termination of the astable state to the point where capacitor 10 is fully charged. This is important because when a monostable circuit is switched to its astable state before its timing capacitor is fully charged, the duration of the astable period is shorter than normal, i.e. than when the timing capacitor is allowed to charge fully. More important, the duration of the astable state is not known beforehand, rendering the circuit output signal useless for most timing operations. To avoid this operation, but allow the circuit to be driven to the astable state at short intervals, short recovery periods are desired. In other words, the more rapidly transistor 12 returns the capacitor 10 to a fixed charge condition, the more rapidly the circuit can be switched to the astable state for a known duration. U.S. Pat. Nos. 3,244,906; 3,191,069; and 3,188,498 illustrate prior efforts to attain short recovery periods in monostable circuits.

The present invention attains a short recovery time by limiting the recharging of the timing capacitor 10 to the known reference voltage at the terminal 20, rather than requiring the circuit to recharge to the higher supply voltage at the terminal 28, which would require a materially longer time.

By way of example, when the reference voltage is two-thirds of the supply voltage, the recovery period of the inventive circuit is three times faster than it conventionally would be by requiring the capacitor to charge to the supply voltage.

A further advantage of the diode 38 is that it prevents the transistor 13 from saturating. This further diminishes recovery time by enabling transistor 12 to turn off rapidly. The transistor 12 cannot saturate, i.e. its collector-base junction cannot become forward-biased, bhcause the diode 38 limits the positive excursion of the transistor base to the reference voltage, which is below the supply voltage to which the transistor collector is connected.

Further, with transistor 12 clamped on, the voltage at its emitter is very nearly equal to the reference voltage at terminal 20. This is because the forward voltage drop in diode 38 is opposite to the transistor 12 base-emitter forward drop. Thus, when these voltage drops are equal, they cancel. For this reason, the diode 38 and transistor 12 are preferably made, as by employing the same semiconductor material, to have equal voltage drops at all operating temperatures.

Another advantage is that the reference voltage supply 21 can have a relatively high internal impedance, which is easy to provide as contrasted to providing a low impedance reference supply. The reason the supply 21 can have a high internal impedance is that it needs to supply only the small clamping current drawn by the diode 38; the current for charging the capacitor 10 during the recovery time comes directly from the supply 29.

Figure 2:
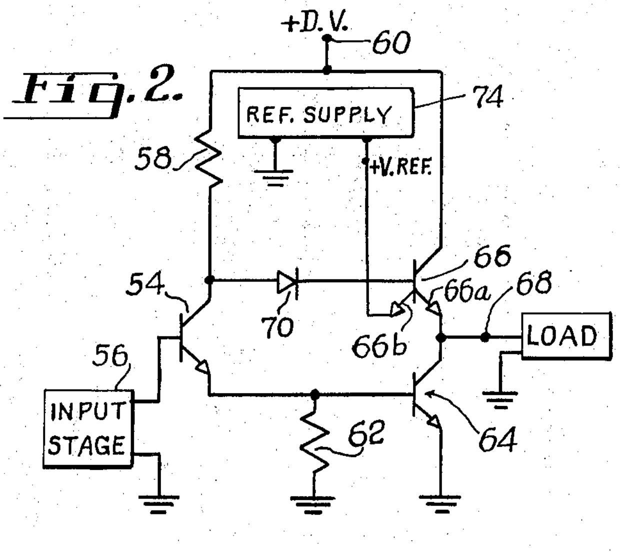
FIG. 2 is a simplified schematic representation of another switching circuit embodying the invention.

Turning to FIG. 2, a switching circuit receives at the base of a phase inverting transistor 54 an input signal from an input stage 56. A resistor 58 is connected between the collector of transistor 54 and a supply terminal 60 that receives a positive direct voltage. A further resistor 62 is connected to ground from the emitter of transistor 54.

The emitter of transistor 54 is also connected to the base of an inverting transistor 64 having a grounded emitter and having its collector connected to an output terminal 68 and to an emitter 66*a* of an emitter-follower transistor 66 having a second emitter 66*b*. The collector of multiple-emitter transistor 66 is connected to the supply terminal 60, and a voltage-cancelling diode 70 is connected between its base and the collector of transistor 54.

Further, and in accordance with the invention, emitter 66*b* is connected to a positive reference voltage developed by a reference supply 74. This places the semiconductor junction formed by transistor 66 base and emitter 66*b* in series between the base and the reference voltage.

With further reference to FIG. 2, when the input stage 56 applies a positive signal to the base of transistor 54, that transistor turns on and its emitter current biases the transistor 64 on to saturation. Correspondingly, the relatively low voltage at the collector of the conducting transistor 54 maintains transistor 66 turned off. Hence in this condition the voltage at the output terminal 68 drops to the near-ground potential at the collector of the saturated transistor 64.

On the other hand, when the input stage switches and applies a zero or negative signal to the base of transistor 54, that transistor is turned off, as is the transistor 64. The high collector-emitter impedance in the non-conducting transistor 54 allows the supply voltage at terminal 60 to bias the base of transistor 66, through resistor 58, sufficiently positive to turn transistor 66 on, thereby applying emitter current to the load connected to the output terminal 68.

Just as the FIG. 1 clamping diode 38 limited the turn-on operation of the FIG. 1 transistor 12, the FIG. 2 junction formed with emitter 66*b* functions as a clamp diode and limits the turn-on operation of transistor 66. This enables the transistor 66 to attain its steady state on condition in minimal time. In addition to rapid turn-on, the advantages accruing to the FIG. 2 circuit from the addition of this junction connected to the reference supply 74 include rapid turn-off because the transistor 66 is held out of saturation and a known stable output voltage corresponding to the reference supply voltage. Further, the incorporation of the base-clamping diode in the transistor by provision of a second emitter often results in size and manufacturing economies. Also, it results in the forward voltage drops associated with the base-emitter 66*a* junction and with the base-emitter 66*b* junction having minimal differences, as desired.

Figure 3:
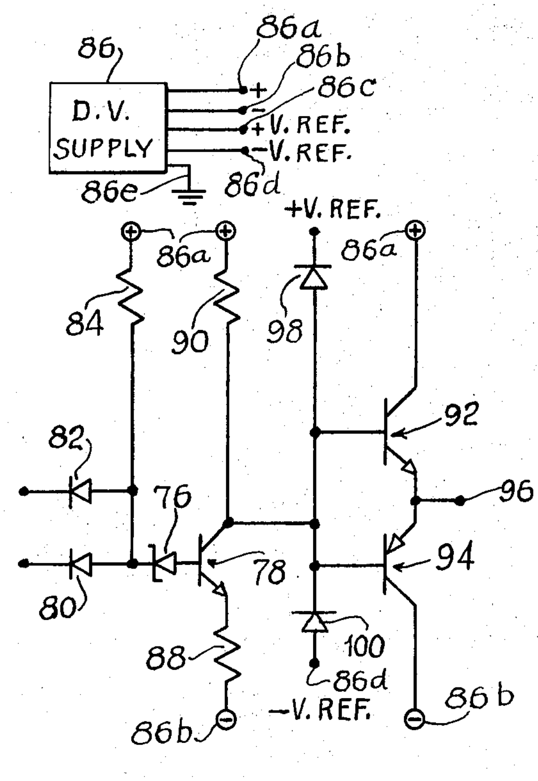
FIG. 3 is a simplified schematic representation of a bipolar digital-to-analog converter embodying the invention.

Turning now to FIG. 3, a bipolar digital-to-analog circuit has a Zener diode 76 in series between the base of a transistor 78 and a coincidence network comprising diodes 80 and 82 and a resistor 84 returned to the positive voltage at terminal 86*a* on a direct voltage supply 86. A resistor 88 is connected from the emitter of transistor 78 to a negative voltage at supply 86 terminal 86*b*; the negative voltage preferably being symmetrical to the positive voltage at terminal 86*a*, i.e. of equal magnitude but opposite polarity. A resistor 90 is connected from the collector of transistor 78 to the positive supply voltage at terminal 86*a*.

As also shown in FIG. 3, two unsymmetrical emitter-follower transistors 92 and 94 have their emitters connected together to an output terminal 96 and have their bases connected together to the collector of transistor 78. The collector of the npn transistor 92 is connected to the positive supply voltage at terminal 86*a* and the collector of the pnp transistor 94 is connected to the equal and opposite negative supply voltage at terminal 86*b*.

The illustrated supply 86 also produces, at terminals 86*a* and 86*d*, positive and negative reference voltages, respectively, of equal magnitudes smaller than that of the supply voltages at terminals 86*a* and 86*b*. Clamping diodes 98 and 100 are connected from the bases of transistors 92 and 94 to the positive reference voltage at terminal 86*c* and to the negative reference voltage at terminal 86*d*, respectively. Diode 98 is arranged to conduct forward current in the same direction as forward conduction in the transistor 92 base-emitter junction, and diode 100 conducts forward current in the same direction as the forward conduction in the transistor 94 base-emitter junction.

The input circuit formed by the FIG. 3 diodes 80 and 82, the Zener diode 76, the transistor 78, and the resistors connected to these components, operates essentially as a bipolar switch applying either a positive or a negative voltage to the bases of the two transistors 92 and 94. In particular, when all input signals to the diodes 80 and 82 are positive so that the diodes are reverse-biased, the Zener diode 76 is back-biased to its Zener breakdown voltage by the positive supply voltage applied to it through resistor 84. The transistor 78 then receives a positive voltage at its base and is conductive, drawing its collector toward the negative supply voltage applied to resistor 88.

On the other hand, a negative signal at any diode 80, 82 causes that diode to conduct with the result that the voltage at the cathode of Zener diode 76 drops to below the Zener breakdown voltage. Consequently, the transistor 78 receives essentially no input base signal and is non-conductive with its collector tending to rise toward the positive supply voltage applied to resistor 90.

In response to the positive voltage developed at the collector of transistor 78 when all the input diodes receive positive signals, the transistor 94 is non-conductive and the transistor 92 is conductive. Diode 98 limits the positive excursion of the voltage at the base of transistor 92 to the positive reference voltage at supply terminal 86c. As a result, the output voltage at terminal 96 is reliably clamped substantially to the positive reference voltage. Specifically, the output voltage is clamped to a voltage offset from the positive reference voltage by the difference between the forward voltage drops in the diode 98 and the emitter-base junction of transistor 92. As noted above, these internal voltage drops are preferably equal, so that the output voltage is essentially equal to the positive reference voltage. Further, as also described above with reference to FIG. 1, although the reference voltage at terminal 86*c* determines the magnitude of the output voltage, the load connected to the output terminal draws current from the supply terminal 86*a*, and not from the reference terminal.

Correspondingly, when a negative input signal applied to one or more of the diodes 80, 82 causes the transistor 78 collector voltage to be negative, transistor 92 is non-conductive while transistor 94 is conductive. The clamping diode 100 then is operative, and constrains transistor 94 to conduct without saturation at an operating level where its emitter voltage, and hence the output voltage at the terminal 96, is substantially equal to the negative reference voltage developed at supply terminal 86*d*. Again, the forward drops in the clamping diode 100 and in the transistor 94 emitter-base junction tend to cancel.

The FIG. 3 circuit thus illustrates the application of the invention to a circuit that develops relatively precise bipolar output voltages with high impedance reference supplies. Further, the switching operation of the circuit is rapid and its output stages do not saturate.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

Having described the invention, what is claimed as new and secured by Letters Patent:

1. A converter circuit comprising:

A. first and second complementary transistors
  a. coupled in series circuit,
  b. coupled between first and second voltage supply sources, and
  c. each having a control electrode;

B. means for directly connecting said control electrodes to each other to form a connection;

C. means for applying a signal to said connection of said control electrodes;

D. semiconductor means, coupled between said first transistor control electrode and a first reference voltage, for limiting the voltage excursion produced by said signal at said first transistor control electrode to the value of said first reference voltage; and E. semiconductor means, coupled between said second transistor control electrode and a second reference voltage, for limiting the voltage excursion produced by said signal at said second transistor control electrode to the value of said second reference voltage.

2. A circuit as defined in claim 1 wherein said first and second transistors each include collector and emitter electrodes, said emitter electrodes coupled together to an output terminal, said first transistor collector electrode coupled to said first voltage supply source, and said second transistor collector electrode coupled to said second voltage supply source.

3. A circuit as defined in claim 2 wherein

A. said first reference voltage is derived from said first voltage supply source; and B. said second reference voltage is derived from said second voltage supply source.

4. A circuit as defined in claim 3 wherein said first transistor is of the NPN type and wherein said second transistor is of the PNP type.

5. A circuit as defined in claim 4 wherein said first voltage supply source and said first reference voltage produce positive voltages and wherein said second voltage supply source and said second reference voltage produce negative voltages.

6. A circuit as defined in claim 2 wherein the magnitude of the voltage produced at said output terminal is substantially equal to the value of either said first reference voltage or said second reference voltage depending upon the value of said signal.

7. A circuit as defined in claim 6 further comprising:

A. a load coupled to said output terminal; and wherein

B. said load draws current from either said first or second voltage supply sources depending upon the value of said signal.

8. A circuit as defined in claim 1 wherein each of said means for limiting are diodes.

9. A converter circuit comprising:

A. an NPN transistor having base, emitter, and collector electrodes;

B. a PNP transistor having base, emitter and collector electrodes, said emitter electrodes coupled to provide an output terminal, said NPN transistor collector electrode coupled to a first positive voltage, said PNP transistor collector electrode coupled to a first negative voltage, and said base electrodes directly coupled to provide a first junction;

C. first voltage clamping means coupled between said first junction and a second positive voltage; and D. second voltage clamping means coupled between said first junction and a second negative voltage.

10. A circuit as defined in claim 9 further comprising:

A. a bipolar switch coupled to provide either a first signal state or a second signal state to said first junction; wherein B. the magnitude of the voltage produced at said output terminal is substantially equal to the value of said second positive voltage when said switch provides said first signal state, and wherein C. the magnitude of the voltage produced at said output terminal is substantially equal to the value of said second negative voltage when said switch provides said second signal state.

* * * * *